(12) United States Patent
Löckenhoff

(10) Patent No.: US 8,704,085 B2
(45) Date of Patent: Apr. 22, 2014

(54) SOLAR MODULE SERIALLY CONNECTED IN THE FRONT

(75) Inventor: Rüdiger Löckenhoff, Ludwigsburg (DE)

(73) Assignee: Fraunhoer-Gesellschaft zur Forderung der Angewandten Forschung e.v., Munich (DE)

( * ) Notice: Subject to any disclaimer, the term of this patent is extended or adjusted under 35 U.S.C. 154(b) by 743 days.

(21) Appl. No.: 12/529,684

(22) PCT Filed: Mar. 7, 2008

(86) PCT No.: PCT/EP2008/001851
§ 371 (c)(1),
(2), (4) Date: Oct. 14, 2009

(87) PCT Pub. No.: WO2008/107205
PCT Pub. Date: Sep. 12, 2008

(65) Prior Publication Data
US 2010/0089435 A1    Apr. 15, 2010

(30) Foreign Application Priority Data
Mar. 8, 2007  (DE) .......................... 10 2007 011 403

(51) Int. Cl.
*H01L 31/0224*   (2006.01)
*H01L 31/05*     (2014.01)

(52) U.S. Cl.
CPC ................................. *H01L 31/0504* (2013.01)
USPC ........... 136/256; 136/259; 136/251; 136/244; 438/59; 438/65; 438/67

(58) Field of Classification Search
USPC .................. 136/256, 259, 251, 246, 244, 243; 438/57, 98
See application file for complete search history.

(56) References Cited

U.S. PATENT DOCUMENTS 3,427,797 A * 2/1969 Akio et al. ..................... 368/205
6,278,054 B1    8/2001 Ho et al.
(Continued)

FOREIGN PATENT DOCUMENTS

JP    55056670    4/1980
JP    58196061    11/1983
(Continued)

OTHER PUBLICATIONS

International Search Report/Written Opinion for PCT/EP2008/001851, completed Dec. 18, 2008.
(Continued)

*Primary Examiner* — Jayne Mershon
(74) *Attorney, Agent, or Firm* — Barnes & Thornburg LLP

(57) ABSTRACT

The present invention shows a solar cell element comprising a semiconductor substrate layer (2) with precisely one first doping, a layer structure (1) which is disposed on the front-side of the substrate layer (2) and is adjacent to the substrate layer, said layer structure having at least one doping complementary to the first doping, a rear-side metallization (3) which is disposed on the rear-side of the substrate layer which is situated opposite the layer structure (1) and is adjacent to the substrate layer, and a first (4) and a second (6) front-side metallization, the first front-side metallization (4) contacting the layer structure (1) electrically and the second front-side metallization (6), electrically insulated from the first front-side metallization and the layer structure (1), being disposed on the front-side of the substrate layer adjacent to the substrate layer.

35 Claims, 11 Drawing Sheets

(56) References Cited

U.S. PATENT DOCUMENTS

Figure 1A:
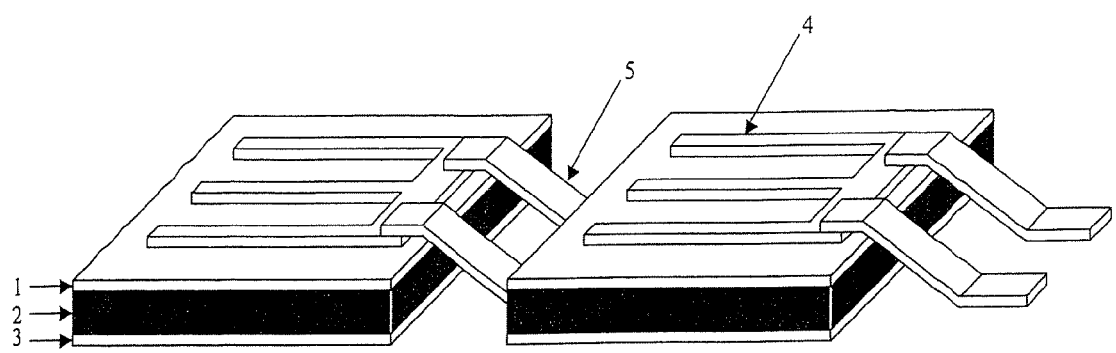

| | | | |
|---|---|---|---|
| 6,452,086 B1* | 9/2002 | Muller | 136/244 |
| 6,635,507 B1 | 10/2003 | Boutros et al. | |
| 7,592,536 B2* | 9/2009 | Glenn | 136/244 |
| 2003/0201007 A1* | 10/2003 | Fraas et al. | 136/246 |
| 2004/0163698 A1 | 8/2004 | Sharps et al. | |
| 2005/0199279 A1 | 9/2005 | Yoshimine et al. | |
| 2007/0102037 A1* | 5/2007 | Irwin | 136/246 |
| 2007/0107773 A1* | 5/2007 | Fork et al. | 136/256 |
| 2007/0272295 A1* | 11/2007 | Rubin et al. | 136/246 |
| 2007/0277810 A1* | 12/2007 | Stock | 126/569 |
| 2008/0023063 A1* | 1/2008 | Hayes et al. | 136/251 |
| 2008/0128014 A1 | 6/2008 | Van Riesen et al. | |

FOREIGN PATENT DOCUMENTS

| | | |
|---|---|---|
| JP | 11112008 | 4/1999 |
| WO | WO2006/053518 A1 | 5/2006 |

OTHER PUBLICATIONS

Guter, W., et al. "Tunnel Diodes for III-V Multi-Junction Solar Cells", Jun. 6-10, 2005, *Presented at the 20$^{th}$ European Photovoltaic Solar Energy Conference and Exhibition*.

Loeckenhoff, R., et al., "1000 Sun, Compact Receiver Based on Monolithic Interconnected Modules (MMS)", 2006, *Institute of Electrical and Electronics Engineers, Inc*.

Office action from EP 08 716 365.5-1228 dated Apr. 1, 2011, with English-language translation, 6 pages.

English-language translation of Notification of the First Office Action from CN 200880007540.5 dated Dec. 8, 2010, 7 pages.

Notification of the Second Office Action from CN 200880007540.5 dated Dec. 21, 2011, with English-language translation, 7 pages.

\* cited by examiner

SOLAR MODULE SERIALLY CONNECTED IN THE FRONT

This is the U.S. national phase of PCT/EP2008/001851, filed Mar. 7, 2008. PCT/EP2008/001851 claims priority to German patent application DE 10 2007 011 403.8, filed Mar. 8, 2007. The disclosures of both DE 10 2007 011 403.8 and PCT/EP2008/001851 are hereby incorporated herein by reference.

The present invention relates to a solar cell element which is suitable for front-side series connection in a solar cell module and also to corresponding solar cell modules. Furthermore, the invention relates to production methods for corresponding solar cell elements and solar cell modules and also to uses of corresponding solar cell elements and -modules in concentrator devices.

The present invention is applied above all in the field of highly concentrating photovoltaic systems (concentrator arrangement). A concave mirror hereby concentrates sunlight with high intensity onto a relatively small module surface. In the case of light intensity which is raised a hundredfold relative to normal sunlight, this is described here as a light concentration ratio of 100 suns. In this way an expensive solar cell surface can be replaced by a relatively inexpensive mirror surface. In the case of a concentration ratio of several 100 suns, also the use of solar cells made of III-V semiconductors and germanium becomes attractive, as are used otherwise typically in space travel applications. High concentration ratios of this type cause however very high electrical current densities. A square centimeter of a highly efficient III-V solar cell with three p-n junctions (triple cell), in the case of 1000 suns, typically delivers a current of fourteen A. In order to keep the losses in the series resistance of the cell low, cells of a very small width in the range of a few millimeters must be used.

Series connections of solar cells (the individual solar cells are subsequently also termed solar cell elements, a plurality of solar cell elements which are connected together then produce possibly, together with their associated carrier structure, one solar cells module) are already known from the state of the art: typically, a known series connection of solar cells is produced by angled cell connectors 5 which lead from the front-side of a solar cell towards the rear-side of the respectively next cell in the series (FIG. 1a). These connectors 5 connect the front-side metallisation 4 of the one cell to the rear-side metallisation 3 of the next cell. In this way, the series connection of a row of solar cells of any length is produced. It is a disadvantage of this connection that the angled cell connectors 5 occupy a relatively large space. A chip spacing or solar cell element spacing of significantly less than 1 mm, as is required for densely packed concentrator modules, is thus not achievable: densely packed concentrator modules are required, or a connection of the cells to form as densely packed a module as possible is required since otherwise light which falls into the intermediate spaces between the solar cell chips or solar cell elements is lost without being used.

Figure 1B:
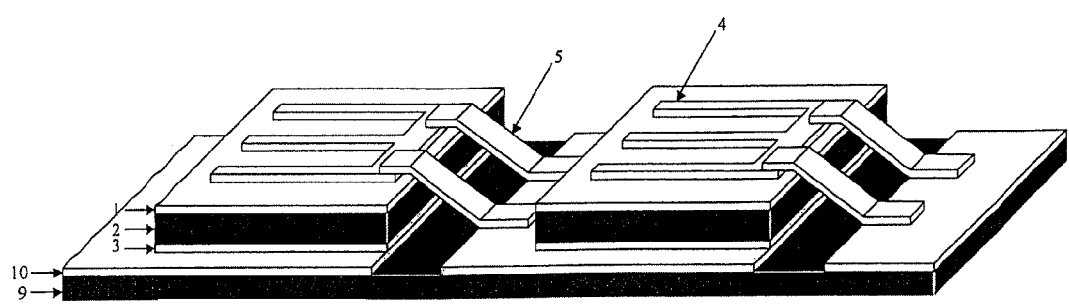

The embodiment according to the state of the art in FIG. 1, by means of the cell connectors 5 on the cell rear-sides, in addition makes difficult thermal coupling of the solar cells to a cooling surface 9, such as e.g. a ceramic substrate or a cooling body. FIG. 1b shows a further possibility for contacting according to the state of the art. A non-conductive substrate 9 (e.g. ceramic) with metallised surfaces 10 is thereby used. The solar cells are mounted on these surfaces. The contacting is now effected from each cell to the respectively next metal surface by the cell connectors 5. Since no rear-side structures are hereby required on the cell, very good thermal coupling is possible, for instance by means of a thin solder- or conductive adhesive layer. However, an additional, relatively wide strip is thereby required beside each cell for the contacting. Highly efficient modules are likewise not achievable in this way because of the relatively high surface loss.

It is hence the object of the present invention to make solar cell elements and solar cell modules available, which are constructed or configured such that, with them, the light losses in the intermediate spaces between the individual solar cell elements can be minimised so that, with them, highly efficient, highly concentrating photovoltaic systems or concentrator arrangements can be made possible.

This object is achieved by a solar cell element according to patent claim 1, a solar cell module according to patent claim 17 and also a production method according to patent claim 32. Advantageous developments of the solar cell elements and solar modules according to the invention and also of the production method according to the invention are found in the respective dependent claims.

The present invention is described subsequently with reference to individual embodiments. Individual features according to the invention, as are shown in the embodiments, given by way of example, in a specific combination, can however occur not only in the shown combinations but, within the scope of the present invention, can also be configured or connected together and used also in any other combinations.

The present invention is based on undertaking the series connection of the individual solar cell elements exclusively on the front-side or on the front-side of the individual solar cell elements. A parallel connection of a plurality of series-connected solar cell chains can be effected on the front-side or rear-side. For this purpose, the individual solar cell elements are suitably configured or constructed, as described subsequently in more detail. The individual solar cell elements can be connected together, because of this construction, exclusively on the front-side with suitably configured cell connectors to form a series or parallel connection.

Relative to the solar cell elements or solar cell modules known from the state of the art, solar cell elements or -modules according to the invention combine the advantages of a flat, metallic rear-side (which facilitates assembly) with the possibility of connecting the solar cells together densely packed to form a solar cell module. As shown subsequently in more detail, individual solar cell elements can be produced according to the invention with an extremely small spacing in the solar cell module.

The present invention is now described with reference to a series of embodiments. In the individual embodiments, identical or corresponding constructional elements or components of the solar cell elements or solar cell modules have identical reference numbers. Their respective description is therefore undertaken only with reference to an individual embodiment (when it first occurs) and is not repeated.

The following reference numbers are used in the Figures for the embodiments:

1, 1a, 1c: Electrically active semiconductor layers of variable doping
2: Supporting semiconductor layer (also termed semiconductor substrate layer or substrate layer) with precisely one type of doping (n- or p-type) or wafer
3: Rear-side metallisation of the solar cell or bypass diode
4: Front-side metallisation of the solar cell
4a: Front-side metallisation of 13
4b: Front-side metallisation of 14
4c: Front-side metallisation of 15

5: Angled cell connector for contacting cell front- and rear-sides according to the state of the art
6, 6a, 6b, Front-side metallisation on the substrate 2 of a solar cell
S6: element in a gap of the electrically active layer 1 or 1a, 1c.
B6: Like 6, only with a bypass diode
7, 7a, 7b: Front-side cell connector between two solar cell elements
B7: Front-side cell connector between two bypass diodes
SB7: Front-side cell connector between a solar cell element and a bypass diode
8, 8a, 8b: Solar cell comprising numerals 1, 2, 3, 4 and 6 and possibly further elements, such as insulation- or antireflection layers according to the state of the art
9: Cooling surface, e.g. a ceramic substrate or a cooling plate or a cooling body
10: Metallic strip conductor structure on the cooling surface 9
11: Solder layer or thermally conductive adhesive layer
12: Metallic buses which are applied on the ceramic substrate 9
13: Individual bypass diode, 13a: individual bypass diode with reversed polarity to 13
14: Bypass diode which is placed on a common supporting semiconductor layer 2 with a solar cell 8
15: Bypass diode for front-side contacting
16: p-doped germanium substrate, base of the germanium cell
17: Germanium n-doped by diffusion, emitter of the germanium cell
18: Tunnel diode between the germanium and GaAs cell
19: MOVPE-deposited, p-doped gallium arsenide (p-type GaAs), base of the GaAs cell and bypass diode
20: MOVPE n-type GaAs, emitter of the GaAs cell and of the bypass diode
21: Tunnel diode between the GaAs and GaInP cell
22: MOVPE-deposited, p-doped gallium indium phosphide (n-type GaInP), base of the GaInp cell
23: MOVPE n-type GaInP, emitter of the GaInP cell
24: MOVPE-deposited GaAs, cover layer for low-ohmic metal semiconductor contacts
25: Palladium (Pd) layer of the metallisation
26: Germanium (Ge) layer of the metallisation
27: Highly conductive metallisation layer, e.g. galvanic gold or vacuum-deposited silver
28: Transparent front-disc
29: Transparent sealing compound
30: Gaps for separating the solar cell elements.

There are shown:

FIG. 1 a series connection of two solar cell elements according to the state of the art.

FIG. 2 a series connection of solar cell elements according to the present invention.

Figure 2A:
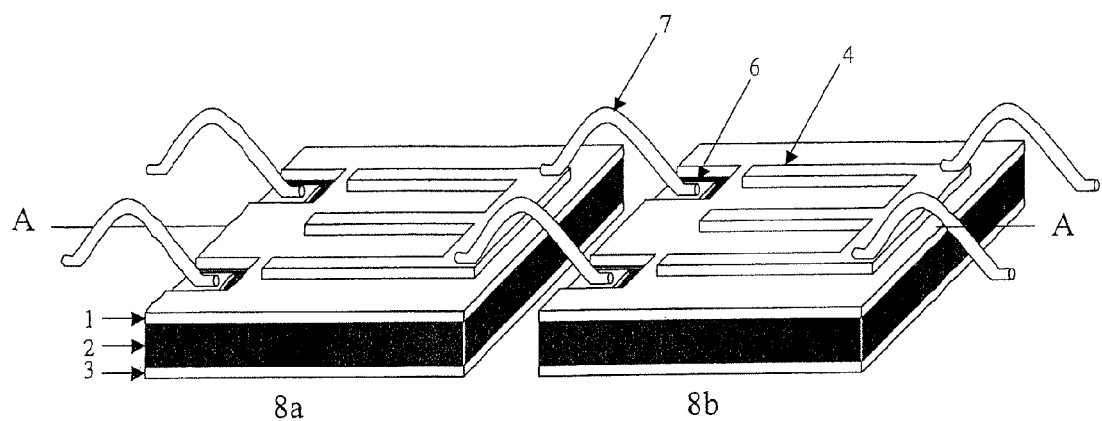
Figure 2B:
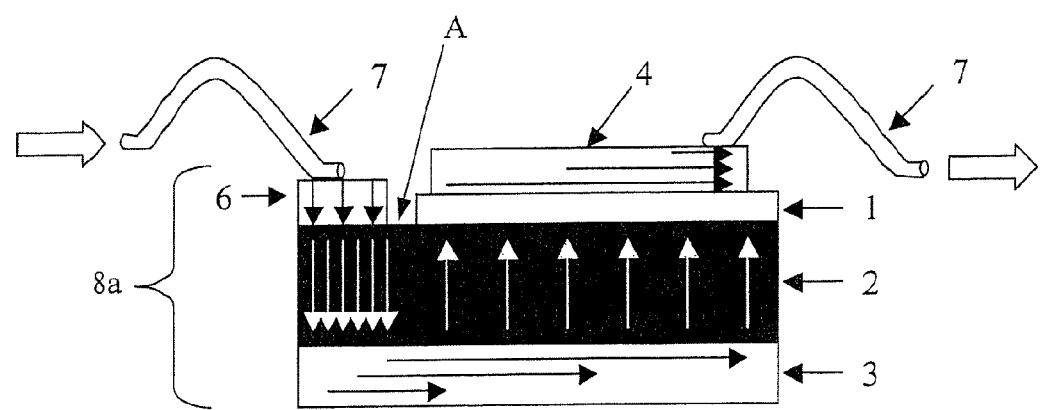
Figure 2C:
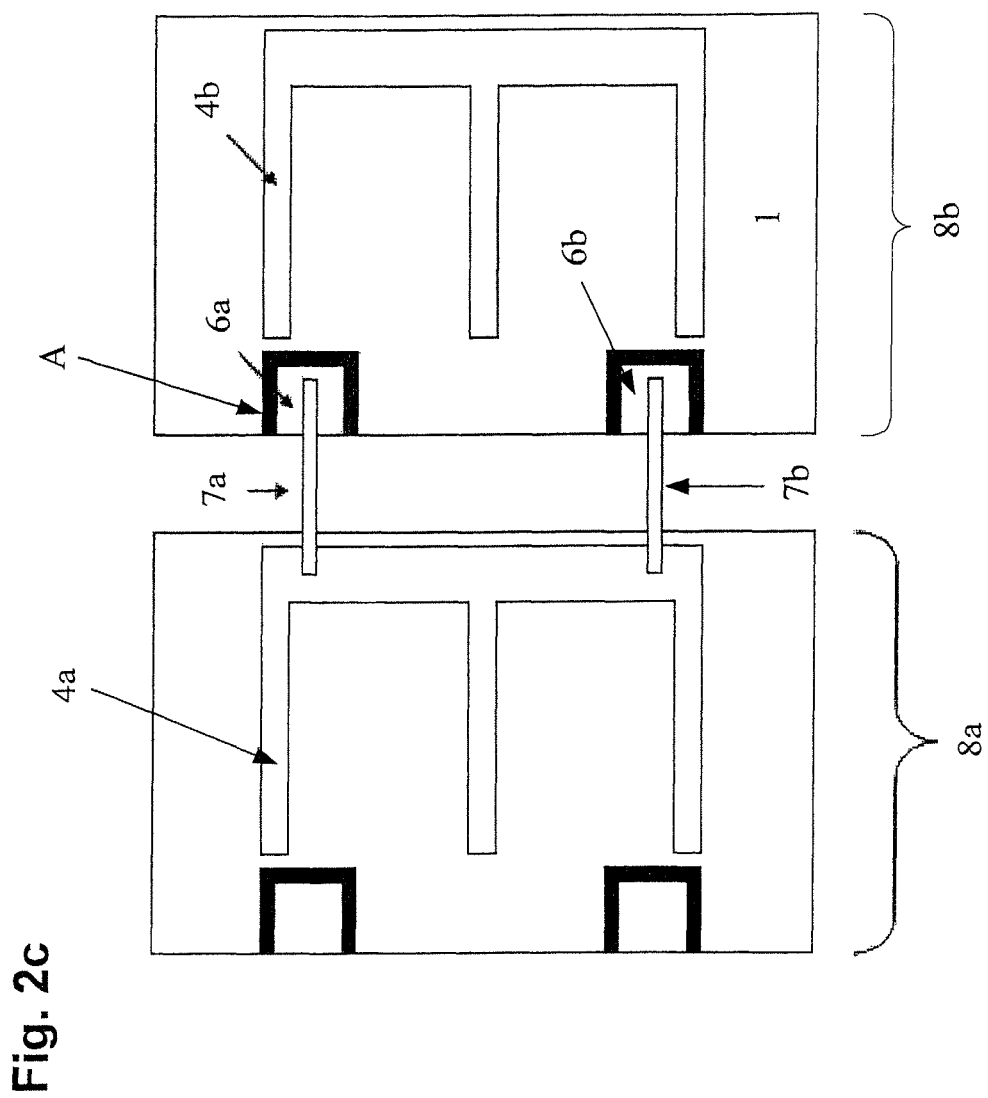
Figure 3:
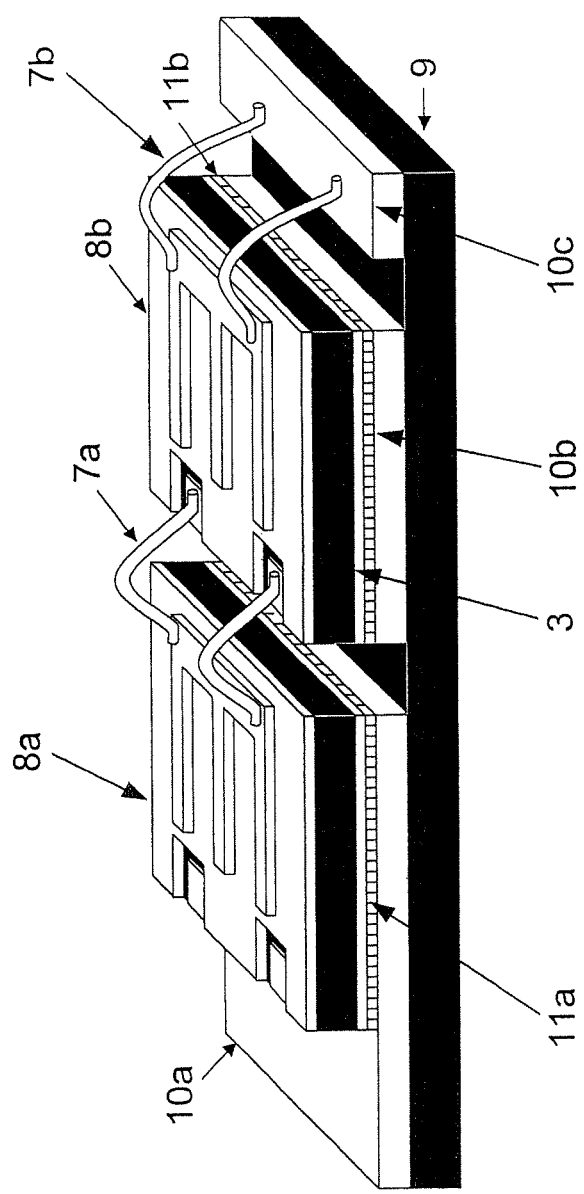

FIG. 3 the production of the series connection according to FIG. 2 on a carrier structure.

Figure 4:
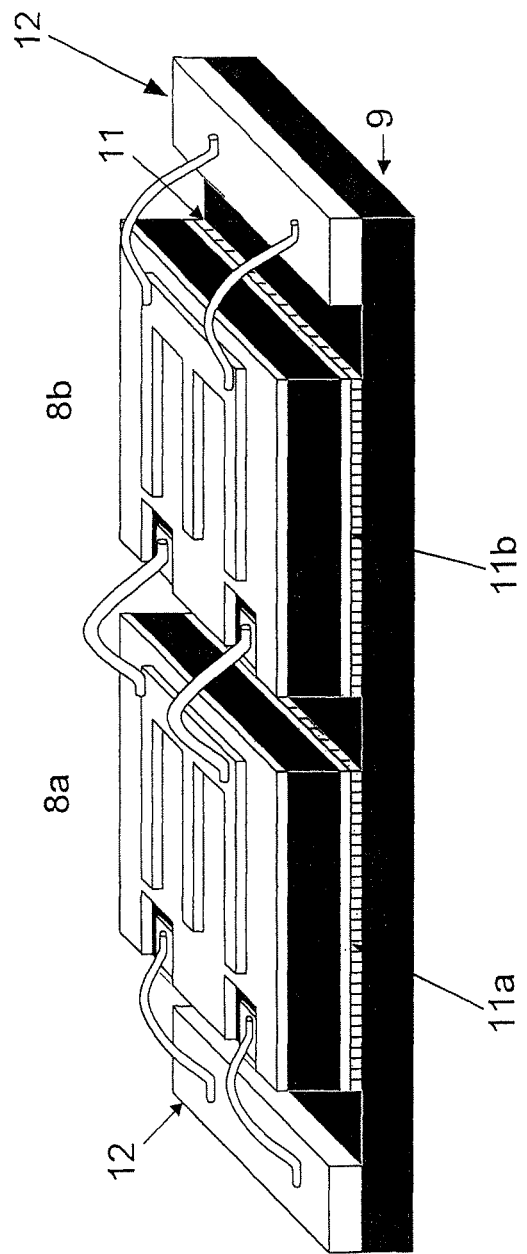

FIG. 4 a further production possibility of the arrangement shown in FIG. 2 on a carrier structure.

FIG. 5 the combination of an arrangement according to the invention according to FIG. 2 with a carrier structure and with bypass diodes.

FIG. 6 a further possibility for producing a combination of the arrangement according to the invention according to FIG. 2, comprising bypass diodes and comprising a carrier structure.

FIG. 7 a further combination possibility of this type, as is shown in a similar form in FIGS. 5 and 6.

Figure 8:
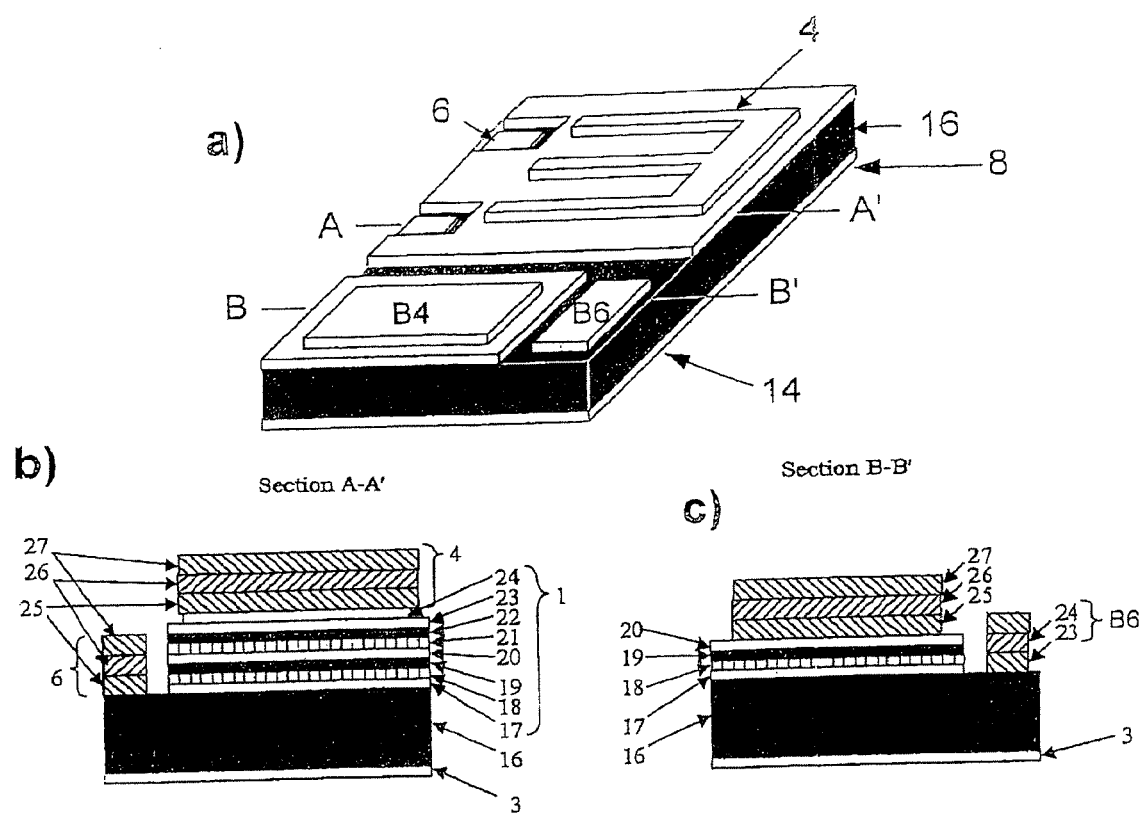

FIG. 8 a preferred production of a solar cell element according to the invention based on a triple solar cell and a corresponding production of a bypass diode.

Figure 9:
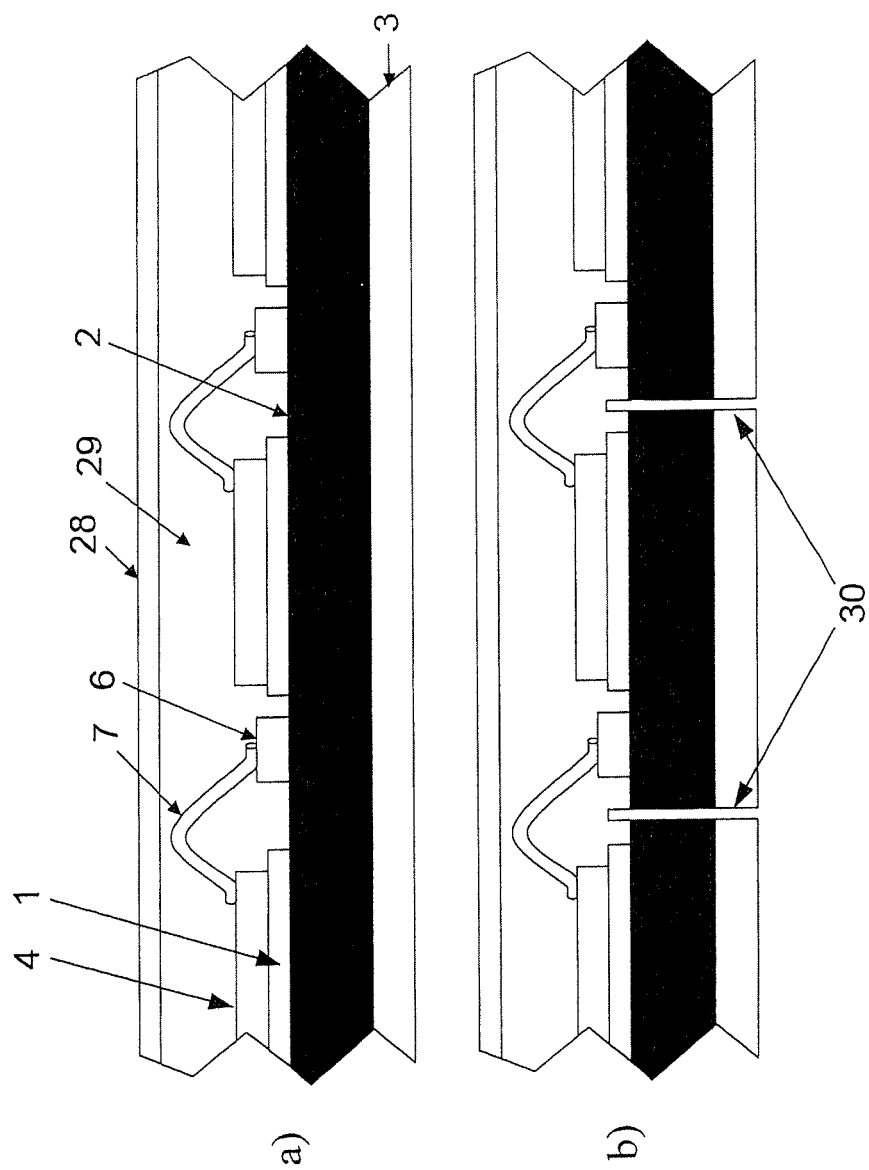

FIG. 9 a preferred assembly variant of a solar cell module according to the invention.

Figure 10:
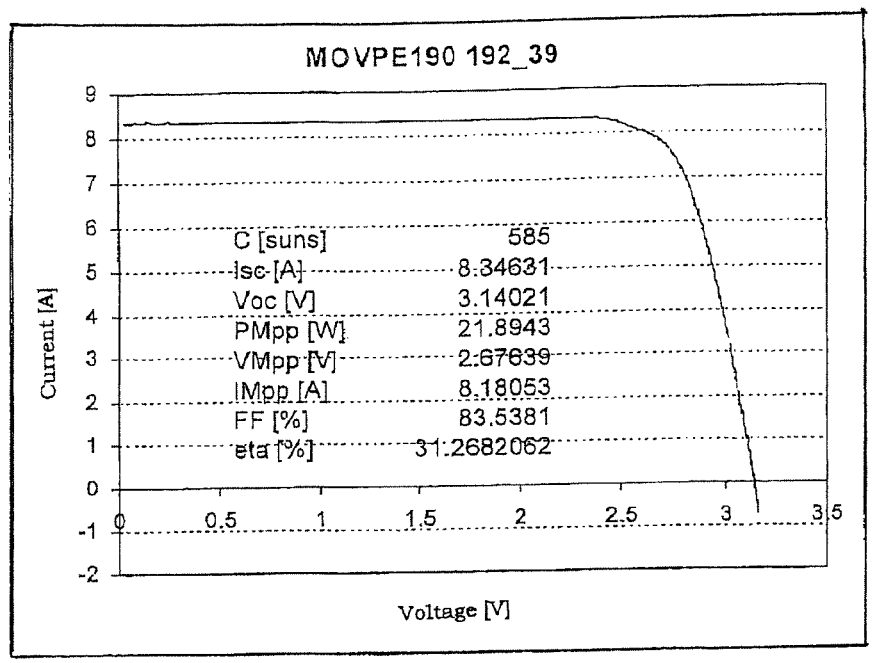

FIG. 10 efficiency achieved in the case of an embodiment configured according to FIG. 2b with a solar cell contacted exclusively on the front-side.

FIG. 2 shows two solar cell elements 8a, 8b according to the invention and also an electrical series connection of these two solar cell elements to form a solar module according to the invention. FIG. 2a shows this in a three-dimensional overview diagram, FIG. 2b shows one of the solar cell elements according to the invention (element 8a) in a sectional view in the plane A-A perpendicular to the semiconductor layer plane of the arrangement and perpendicular to an axis on which the individual solar cell elements are disposed at a spacing from each other and adjacently (direction of the electrical series connection). FIG. 2c shows a plan view on the arrangement according to the invention perpendicular to the semiconductor layer plane.

Each of the solar cell elements 8a, 8b according to the invention comprises the following components: a supporting semiconductor layer (subsequently alternatively also termed wafer, semiconductor substrate layer or simply substrate layer although an electrically inactive layer is not absolutely hereby involved), a rear-side metallisation 3 which is disposed on one side of the semiconductor substrate layer 2 and adjacent to the latter (in the picture, the underside of the layer 2), and a first front-side metallisation 4 which is disposed on the upper side (on the side orientated away from the rear-side metallisation), second front-side metallisation 6 and also layer structure 1. The supporting semiconductor layer R involves the wafer. During stacking, the layer 2 can form the base of the lowermost solar cell. The metallisation 3 can be a planar, in particular a whole-surface, non-structured metallisation (generally the case in the subsequent examples), however it can also concern a structured metallisation which does not cover the entire surface (not continuous). The layer structure 1 is disposed on the upper side of the substrate layer 2 adjacent thereto so that the entire surface of the substrate layer 2 is not covered by the layer structure 1. The upper side (front-side) of the substrate layer 2 hence has a gap A which is not covered by the layer structure. Within this gap A, the second front-side metallisation 6 of the solar cell element is disposed directly adjacent to the substrate layer 2 and on the latter laterally at a spacing from the layer structure 1. Because of the lateral spacing between the layer structure 1 and the front-side metallisation 6, these two elements 1, 6 are hence insulated from each other electrically. On the layer structure 1 and adjacent to the latter, the first front-side metallisation 4 of the solar cell element is disposed. This structure 4 is disposed here such that the layer structure 1 is partially covered but no lateral protruding portions of the first front-side metallisation 4 beyond the layer structure 1 are produced.

As in particular the plan view in FIG. 2c shows, the second front-side metallisation 6 is configured here by means of two separate individual elements 6a and 6b which are disposed at a spacing from each other on the substrate layer or the wafer 2. These are disposed on the end-side adjacent to a side surface of the solar cell elements 8a, 8b such that, viewed relative to the front-side surface of the elements 8a, 8b, they are surrounded completely by the layer structure 1 (hence an E-shaped configuration of the layer structure 1 is produced, which completely covers the entire surface of the substrate layer 2 apart from the surface portions which are covered by the second front-side metallisation 6a, 6b and also two narrow channels between the elements 1 and 6a, 6b). On the layer structure 1 and, viewed in the section plane, not projecting laterally beyond the latter, hence likewise at a spacing and electrically insulated from the second front-side metallisation 6, the first front-side metallisation 4 of the element 8 is applied here in the shape of a comb.

The first front-side metallisation 4 and the second front-side metallisation 6 are those electrical contacts of the solar cell element which, in normal operation, transport the main part of the electrical current in a solar cell module.

The first front-side metallisation 4 is applied here in the form of a continuous area (comb-shape), the second front-side metallisation 6 in the form of a plurality, here two, of islands which are separated from each other, then per se again respectively continuous (here cuboid). However it is also likewise readily possible to configure the first front-side metallisation in the form of a plurality of such separated islands and the second front-side metallisation 6 in the form of a continuous layer structure. Likewise, it is of course possible to configure both the first and the second front-side metallisation respectively in the form of a plurality of non-continuous islands or to configure both front-side metallisations in the form of respectively individual, continuous layer structures.

By means of the shown arrangement of the layer structure 1 and the second front-side metallisation 6 (in the form of the two elements 6a and 6b) on the surface of the substrate layer 2 of a solar cell element, the advantage is hence achieved that the loss of active solar cell surface can be minimised.

As FIGS. 2a, 2b and 2c show, the first front-side metallisation 4a of the solar cell element 8a shown on the left is connected via two electrically conductive cell connectors 7a and 7b to the second front-side metallisation 6 of the solar cell element 8b shown on the right. The cell connector 7a hereby connects the first front-side metallisation 4a of the left solar cell to the element 6a of the second front-side metallisation of the right solar cell, the second cell connector 7b connects the element 4a correspondingly to the front-side element 6b. The two cell connectors 7a, 7b are hereby configured as ultrasonically welded gold wires.

On the rear-side situated opposite the elements 1, 4 and 6, respectively the rear-side metallisation 3 of the solar cell elements 8a, 8b extends from the region of the second front-side metallisation 6 of the element 8a, 8b as far as the region of the first front-side metallisation 4 of the element. If the elements 1, 4 and 6 were projected therefore perpendicular to the layer plane towards the rear-side metallisation 3, then this rear-side metallisation would completely enclose the projected elements 1, 4 and 6.

Hence a low-ohmic, exclusively front-side series connection of the solar cells 8a, 8b is illustrated. The solar cells comprise the supporting semiconductor layer 2 with a first type of doping (p- or n-type) and the layer or layer structure 1 with variable doping which has at least one doping deviating from 2. In general, the layer 2 is that part of the semiconductor disc which serves as base of the (lowermost) solar cell. The layer 1 is formed by the emitter of the (lowermost) solar cell and possibly further solar cell junctions and layers. The layer 1 is provided with the front-side metallisation 4 which has, relative to the semiconductor layer, a low ohmic contact resistance. Likewise, the layer 2 with the rear-side metallisation is provided with a low contact resistance. Furthermore, the semiconductor layer 1 on the cell front-side is removed in places in region A. At these places, the metallisations 6 with a low contact resistance are applied on the front-side on the semiconductor layer 2. The metallisations 6 and 4 can be applied in one common or also in separate metallisation steps. The series connection in a series of solar cells is now effected respectively by the front-side metallisation 4 of one cell to the metallisations 6 of the next cell. FIG. 2b shows a cross-section through the cell together with the cell connector. The current path is symbolised here by arrows (without restriction to one polarity). The current emerges from the cell connector 7 through the metallisation 6 into the supporting semiconductor layer 2 which is directly adjacent to this metallisation. It flows through the supporting semiconductor layer 2 (wafer) with a high current density and reaches the rear-side metallisation which is directly adjacent to the wafer 2 and is readily conductive electrically. The current there is distributed over the cell rear-side. It is essential that the wafer layer 2 is situated exclusively between the metallisation 6 and the rear-side metallisation 3. The actual generation of electrical power is effected in the semiconductor layer (-structure) 1, the supporting semiconductor layer 2 being able to act as "base" of the (lowermost) solar cell. The current thereby flows distributed over the active solar cell surface 1 through one or more p-n junctions until it finally reaches the front-side metallisation 4. From there, it flows through a further cell connector 7 to the next cell. For easier reference, the solar cell comprising the numerals 1, 2, 3, 4 and 6 and also further elements, such as for example an insulation- and/or antireflection layer, is characterised with the numeral 8. In the following Figures only two solar cells respectively are shown. However, it is understood that larger solar cell modules can be achieved in the same way by means of a corresponding series connection of any number of solar cells. Likewise, a parallel connection of any number of solar cells or series-connected solar cell chains can be effected.

FIG. 3 shows a further embodiment in which the solar cell arrangement according to the invention (solar cell elements 8a and 8b) of FIG. 2 is disposed on a carrier structure 9, 10, 11. The element 9 is a cooling plate with an electrically non-conductive front-side (e.g. an active water cooling body with a ceramic front or a ceramic plate which, for its part, is generally mounted on an active cooling body. The cooling plate or composite comprising plate and active cooling body is subsequently termed alternatively also "heat sink" for simplification. This carrier structure has furthermore electrical strip conductor structures 10a and 10b which are electrically insulated from each other and disposed on the upper side of the cooling plate or of the heat sink 9 and also solder layers 11a and 11b which are respectively disposed on the upper side (side orientated away from the heat sink) of the strip conductor structures 10a and 10b (alternatively, this can also involve a layer made of an electrically and thermally conductive adhesive). The solar cell element 8a is disposed on the solder layer 11a, the solar cell element 8b on the solder layer 11b. The series connection shown in FIG. 3 (positioning of the solar cells on common strip conductors) is suitable for pair-wise parallel connection of a plurality of series-connected solar cell chains. This connection enables compensation of the current generation in the case of parallel-connected solar cells and hence lower losses with non-homogeneous illumination.

The illustrated arrangement according to the invention combines the advantages of a flat, metallic solar cell rear-side which facilitates assembly with the possibility of connecting the solar cells 8 to form a module in a densely packed manner. The solar cells are hereby mounted on a strip conductor structure 10 with conductive adhesive or solder layers 11, said strip conductor structure being located in turn on the cooling surface 9. The connection of the cells to each other is effected on the front-side by cell connectors 7a. The rear-side of the first cell on the left in the picture is contacted directly via a strip conductor of the strip conductor structure 10 and forms one pole of the series connection. In contrast, cell connectors 7b connect the front metallisation of the last cell, on the right in the picture, to a separate strip conductor 10*c* of the strip conductor structure 10 which is disposed at a lateral spacing from the block 10*b*, 11*b*, 8*b* on the cooler 9 and forms the other pole of the series connection. The series connection produced in this way can be extended to any number of series-connected cells. It is likewise possible to dispose a plurality of these series-connected series in parallel.

FIG. 4 shows a further arrangement according to the invention of a solar cell module according to the invention according to FIG. 2 on a carrier structure 9, 11 which has a cooling structure 9. The heat sink 9 is likewise configured here as a non-conductive heat sink with a ceramic front (e.g. as a ceramic front plate which is a structure-supporting part of a water cooling body, e.g. by the firm Curamik), but alternatively can also be produced as a metallic heat sink. On the surface of the heat sink with a ceramic front, respectively one electrically non-conductive layer 11 comprising adhesive or comprising an insulator (e.g. ceramic) is disposed under the two solar cell elements 8*a*, 8*b*. In addition, the layer 11 can comprise a dielectric, such as polyimide or $SiO_x$. The rear-side metallisation 3 respectively of both elements 8*a*, 8*b* is then disposed on the layer portions 11*a* and 11*b* which are configured here separately and at a spacing from each other. In the production in FIG. 4, the strip conductor structure 10 is dispensed with, this is therefore not absolutely required for the series connection of the solar cells. Instead, merely lateral current-supplying buses 12 are required. The function of the series connection remains unimpaired by this. In connection with an electrically non-conductive adhesive layer 11 or an additional insulation layer, even a metallic cooling body can be used as cooling surface 8 without the latter resulting in a short circuit of the series connection. Of course, the buses 12 need not be in electrical contact with the heat sink for this purpose. If as here a ceramic front plate 9 without a strip conductor structure 10 is used, then a merely thermally conductive adhesive can be used for the assembly in order to avoid short circuits as a result of overflowing adhesive.

In a series connection of solar cells, the short circuit currents of the individual cells differ. This applies in particular when the module is illuminated non-homogeneously. The distribution of the light in the focal point of a concentrator system will never be entirely homogeneous. If now such a solar module is operated in short circuit, it will generally provide a solar cell which restricts the current of the entire module. At this solar cell, a high voltage which is generated in the module by the other solar cells tapers off in the blocking direction. With a sufficiently high blocking voltage, this cell is destroyed and another cell becomes current-limiting. For this reason, it is necessary to protect the solar cells by means of bypass diodes which are connected to the cells in parallel but with reversed polarity. It is explained subsequently how protection of the solar cells by bypass diodes can be achieved according to the invention.

Figure 5A:
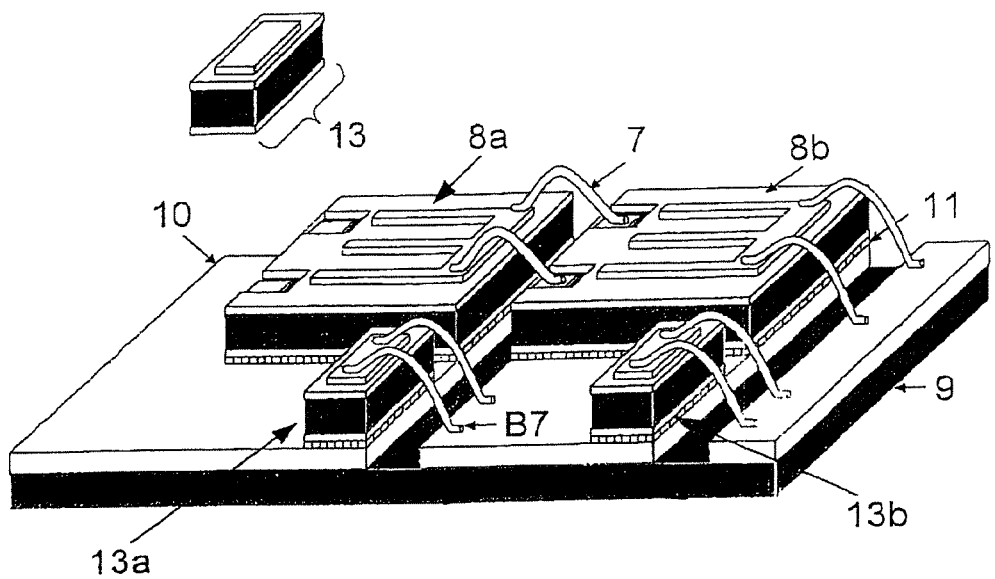
Figure 5B:
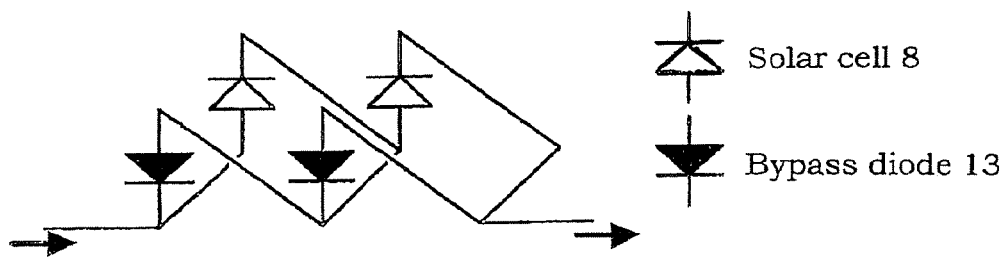

FIG. 5 shows a further embodiment of the present invention in which two series-connected solar cell elements 8*a*, 8*b* respectively have a bypass diode (e.g. Schottky diode) which is connected in parallel to the respective solar cell element but with reversed polarity. The carrier structure 9, 10, 11 is configured here as in the example shown in FIG. 3. The strip conductor structure 10 here has however a greater base surface so that laterally, next to each solar cell element, the associated separate bypass diode 13 respectively can be placed on the strip conductor structure. In FIG. 5*a*, it is shown how the bypass diodes 13 are placed together with the solar cell elements 8 on strip conductors of the conductor structure 10. By means of the electrical connection of the rear-side metallisation 3 of a solar cell element to a correspondingly configured rear-side metallisation of the associated bypass diode 13 with the help of the conductor structure 10, it becomes possible by means of a series connection of the solar cell elements with the help of the cell connectors 7 and also by means of a corresponding series connection of the separate bypass diodes 13*a, b* with the help of analogously configured cell connectors B7 to connect the solar cells in series and to connect a bypass diode with reversed polarity in parallel to each solar cell (see circuit diagram in FIG. 5*b*).

Figure 6A:
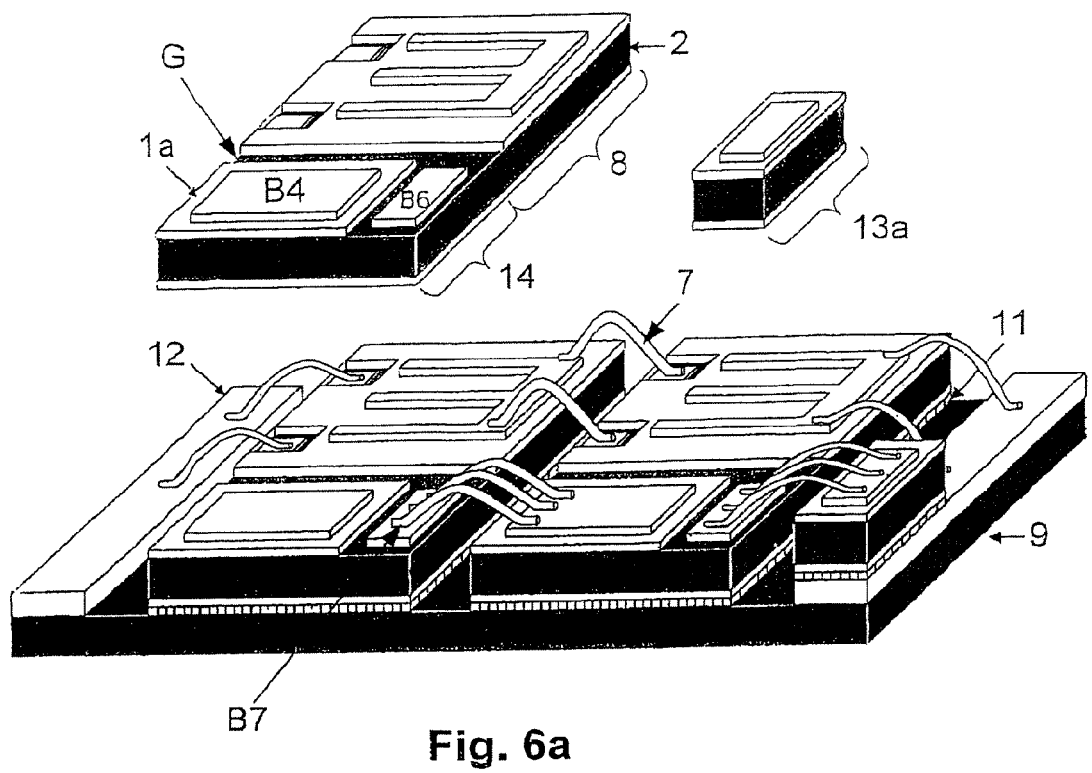
Figure 6B:
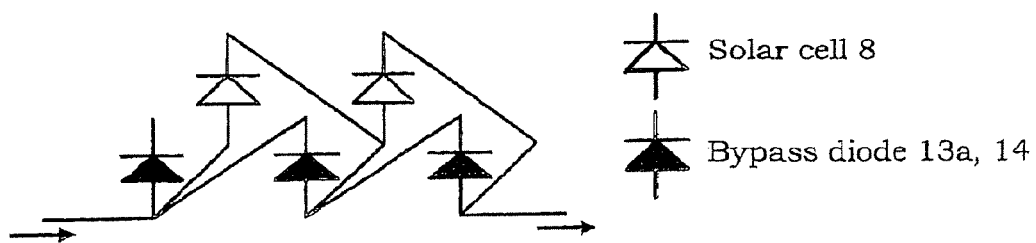

FIG. 6 shows a further embodiment of an embodiment according to the invention using bypass diodes 13*a*, 14, the carrier structure 9, 10, 11 here being configured again as in the example shown in FIG. 4. The bypass diodes 14 are hereby produced such that the substrate layer 2 of the solar cell elements is made available with an enlarged base area and such that a part 1*a* of the electrically active layer structure 1 of the solar cell elements is separated on the front-side (channel G in which the layer structure 1 on the front-side of the substrate layer 2 is missing; as a result, the configuration of two separate regions, the bypass diode region 14 and the solar cell element region 8). On the rear-side of the substrate layer 2, a common rear-side metallisation 3 is then configured for the two regions 8 and 14. The electrical connection of the bypass diode elements 14 and of the solar cell elements 8 is effected in principle as shown in FIG. 5 (see FIG. 6*b*).

In the bypass diode region 14, a first front-side metallisation 134 of the bypass diode is disposed on the front-side of the substrate layer 2 on the separated region 1*a* of the electrically active layer which is disposed on the substrate layer 2. Electrically separated from the elements 1a and B4, laterally thereof likewise in the bypass diode region 14, a second front-side metallisation B6 of the bypass diode is disposed. The connection of adjacent bypass diodes takes place entirely analogously to the connection of adjacent solar cell elements in that the second front-side metallisation B6 of a bypass diode 14 is connected to the first front-side metallisation B4 of an adjacent bypass diode by means of cell connectors B7.

FIG. 6*a* is hence constructed in the embodiment in FIG. 4 in which no conductor structure 10 is provided below the solar cells. Here, the bypass diode 14 and the solar cell 8 are combined on a common chip. For this purpose, a part of the electrically active layer 1 is separated and now termed 1*a*. If 1 comprises a plurality of diode junctions, then it is possible to remove one or more diode junctions from 1*a* without restricting the effect as bypass diode 14. Metallisations B4 and B6 are applied on the bypass diode for the contacting. The contacting is effected now in the case of the solar cells analogously to FIG. 3. Similarly, but with reversed polarity, the bypass diodes 14 are connected. If the equivalent circuit diagram FIG. 6*b* is considered then it will be noticed that the bypass diode 14, on the left in the picture, remains unused, whereas the solar cell 8 on the right in the picture is not protected by a bypass diode 14. Therefore, a further individual bypass diode 13*a* is necessary, which is connected in parallel to the right cell.

FIG. 7 shows a further embodiment according to the invention of the connection of solar cell elements 8 with bypass diodes 15. The bypass diodes 15 are configured here as separate bypass diodes, i.e. the solar cell elements 8 and the bypass diodes 15 have no common structures (as for example substrate layers 2 or rear-side metallisations 3).

The carrier structure 9, 11 is configured here analogously to FIG. 4, however respectively one electrically non-conductive adhesive- or insulating layer 11 is disposed here correspondingly between the rear-side metallisations 3 of the two bypass diodes and the rear-side metallisations 3 of the two solar cell elements which are disposed separately therefrom.

Figure 7A:
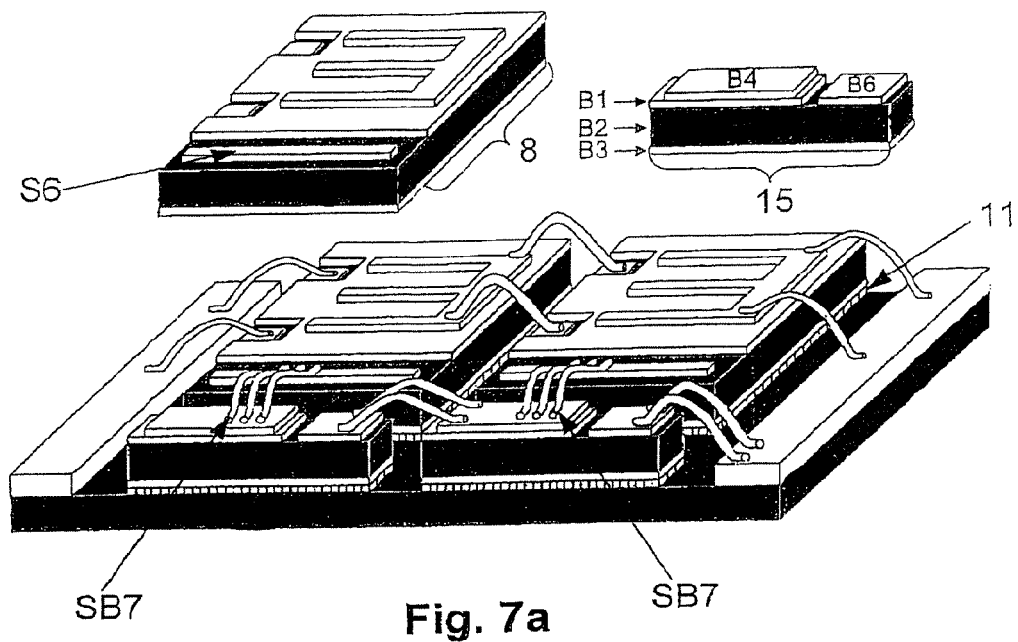
Figure 7B:
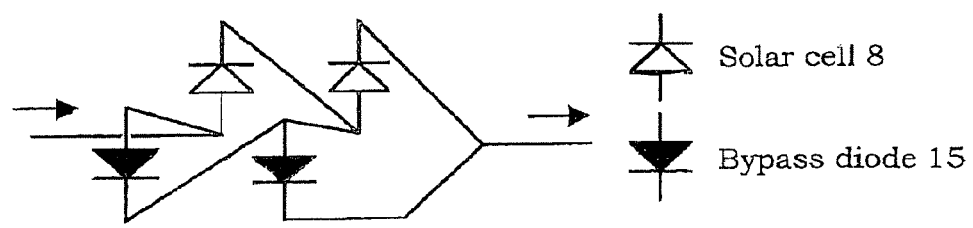

An electrical connection of the solar cell elements and bypass diodes analogous to the previously described ones can be achieved now as follows (FIG. 7a hereby shows that, even without a conductor structure 10 below the solar cell elements 8, such a connection to external bypass diodes 15 is possible): for this purpose, the separate bypass diodes 15 must be suitable for the front-side connection similarly to the solar cells 8. They therefore comprise here a doped, supporting semiconductor layer B2, a doping B1 which is situated opposite the layer disposed on the front-side thereof and covered by only a part of the semiconductor substrate B2. On the uncovered surface, a metallisation B6 is applied as contact on the supporting semiconductor layer B2, electrically insulated from the layer B1. A metallic contact B4 is also applied on the doped layer B1. The rear-side metallisation B3 of the separate bypass diodes 15 is configured as in the case of the solar cell elements 8. In order to produce the above-described electrical connection, the solar cell elements 8 have an additional lateral surface, on which the semiconductor substrate 2 is not provided with the layer structure 1. On this surface, an additional metallic contact S6 is then applied on the front-side on the substrate layer 2, electrically insulated from the layer structure 1 and at a lateral spacing from the latter. This electrical contact S6 of each solar cell element 8 is connected via a cell connector SB7 which is configured analogously to the cell connectors 7, B7 on the front-side to the metallic contact B4 of the associated bypass diode. As shown in FIG. 6, the metallic contact B4 of a bypass diode is then connected on the front-side again to the metallic contact B6 of the adjacent bypass diode by means of cell connector B7. The bypass diodes and the solar cells are hence, as can be seen in FIG. 7, respectively connected in series. In addition, a parallel contact between the surfaces S6 on the solar cells and B4 on the bypass diodes is produced by cell connector SB7. As is evident from the equivalent circuit diagram in FIG. 7b, each solar cell is protected in this way by a parallel-connected bypass diode with reversed polarity.

FIG. 8 shows a preferred embodiment according to the invention of a solar cell element based on a triple solar cell. FIG. 8a hereby shows a three-dimensional overview, FIG. 8b shows a section through the solar cell element with integrated bypass diode at the level of the solar cell region 8, FIG. 8c shows correspondingly a section at the level of the bypass diode region 14 (sections perpendicular to the sectional plane).

Typically a p-doped germanium semiconductor disc 16 (germanium wafer) with a thickness of 150 μm serves as supporting semiconductor layer 16 (corresponding to 2). In order to achieve the through-contactings between the metallisation layers 6 or B6 and the rear-side metallisation 3 to be as low-ohmic as possible, as high a doping as possible $>10^{17}/cm^3$ and as small a germanium thickness as possible should be chosen. By means of metal organic vapour phase epitaxy MOVPE or molecular beam epitaxy MBE, a layer structure is now deposited. The lowermost deposited layer contains dopants which produce an n-doped germanium layer 17 by diffusion so that the p-n junction of the germanium solar cell is produced. Subsequently, a tunnel diode structure 18 is deposited, followed by p-doped GaAs layer 19 and an n-doped GaAs layer 20 which form a GaAs solar cell. After a further tunnel diode 21, a GaInP solar cell comprising a p-doped base 22 and an n-doped emitter 23 is deposited. A GaAs cover layer 24 allows subsequent configuration of a low-ohmic metal-semiconductor contact between the cover layer 24 and the metallisation 4. The actual MOVPE grown layer structure also contains further functional layers for improving the efficiency of the solar cells (e.g. passivation layers) which are unimportant here for comprehension.

Processing of the wafer 16-24 to form a solar cell follows. For this purpose, the layers 17-24 or 21-24 are removed at places by photolithography and etching. In a further photolithographic step, the metallisation structure is deposited, which structure comprises at least one palladium layer 25, a germanium layer 26 situated thereabove and a conductive layer 27 (generally silver or electroplated gold). The palladium-germanium layer sequence has the particular property of forming ohmic contacts with very low contact resistances both on the n-doped GaAs layers 20 and 24 and on the p-doped germanium substrate 16. This takes place by controlled chemical reactions in a solid phase when heating the semiconductor discs under protective gas (alloying of the contacts).

In this way, the front contact 4 of the solar cell, the front contact B4 of the bypass diode and also the contacts 6 and B6 are produced on the p-germanium substrate. For low-ohmic contacting through the germanium substrate 16, another low-ohmic contact is required on the rear-side 3. This can comprise for example alloyed aluminium. The further process steps during the solar cell production, such as the mesa etching or the removal of the cover layer 24 with subsequent vapour coating of an antireflection layer are known to the person skilled in the art and are not intended to be explained here in more detail.

Typically, the production of a concentrator solar cell module is effected in the following sequence:

Processing of semiconductor discs to form solar cells, a large number of smaller cells ultimately being located on each disc Division of the semiconductor discs into individual cells or solar cell elements Assembly of the cells on a cooling surface 9

Series connection of the solar cells.

When using the connection method according to the invention, an alteration to this process sequence can however be advantageous.

Processing of the semiconductor discs to form solar cells (multiple formation of the elements 1, 3, 4, 6 on the substrates 2 so that a plurality of solar cell elements 8 are produced after subsequent separation).

Optional: Division of the semiconductor discs into pieces, again a large number of cells being located on each piece.

Assembly of the entirety of the semiconductor discs or the semiconductor pieces on a cooling surface 9 by means of a solder or adhesive process.

Separation of the semiconductor discs or semiconductor pieces into individual solar cells.

Series connection of the solar cells.

For example a chip saw can be used for separating the semiconductor on the cooling surface. The very fine, diamond-impregnated sawing blade thereof allows cuts of 50 μm width and less. Hence arrangements according to drawings 3 and 4 can be achieved with an extremely small spacing of the solar cell chips 8. Alternatively, for example laser cutting can be used.

For exterior use, in particular in concave mirrors, the module must be encapsulated. A front glass plate mounted with silicone is possible for this purpose. Above all the very low heat conductivity of silicone is thereby limiting and demands an extremely thin silicone layer. In the case of 1000 suns, the layer thickness may at most be for example 0.3 mm in order to avoid overheating of the silicone.

Care must thereby be taken that the height of the cell connectors 7 is typically at least 0.25 mm. It is hence a requirement to control the layer thickness of the silicone very precisely. Water coolers rarely have the low tolerances required therefor. For this reason, the following assembly sequence is possible.

According to FIG. 9*a*), firstly a fairly large semiconductor surface, which comprises a plurality of solar cells or even an entire solar cell wafer with a plurality of solar cells, is provided firstly with cell connectors 7. Subsequently, a front disc 28 has a filling compound 29 applied. A vacuum process can be used here to avoid air bubbles. Maintaining a precisely determined thickness of the silicone layer 28 is unproblematic since the thickness of the solar cell wafer and the front glass sheet varies very little. After curing the filling compound 29, gaps 30 are provided through the rear-side metallisation 3 and the semiconductor material 2. A series-connected, front-side encapsulated module is herewith produced. Coupling of the rear-side metallisation 3 to a cooling plate must be effected such that a short circuit of the series-connected solar cells is precluded.

A very precise method for preparing the gaps, is the use of a chip saw with which a gap width of down to 30 μm can be achieved. Further possibilities would be wet- or dry-chemical etching or a combination of these methods.

The present invention hence describes solar elements or solar cell modules with rear-contacts fitted on the front-side. The contacting is distinguished in particular in that at least one front-side metallic contact surface 6 is separated exclusively by the supporting semiconductor layer 2 of preferably precisely one type of doping from a flat rear-side contact surface 3. What is crucial for high current densities is good transverse conductivity of the rear-side metallisation 3 and the low resistance during passage of the current through the semiconductor layer 2. Such good transverse conductivity can be achieved by a highly conductive metal layer, typically made of Al or Ag (typical thickness of this layer approx. 2 to 3 μm).

The following features (which can be achieved individually or also in any combination in advantageous variants) are of technical significance in particular in the present invention:

- The palladium-germanium contact structure on the front-side (the actual contact has significantly more layers) and the aluminium contact on the rear-side.
- The use of a plurality or precisely one metallisation surface 6 per solar cell.
- The separation of the solar cell chips after assembly by sawing or laser cutting. A fantastically high packing density can thus be achieved. In particular also the assembly of a (virtually) complete solar cell wafer with subsequent separation and series connection.
- The cooling plate 9 can be a structure-supporting part of an active water cooling body. For example, the firm Electrovac (Curamik) produces water cooling bodies which comprise a microchannel structure between two ceramic plates. The front ceramic plate thereby serves at the same time for strengthening the heat sink and as base plate for a conductor structure.
- Contacting of the metal layer 6 to the metal layer 3 through the semiconductor layer 2 with a surface-specific resistance of less than $5*10^{-4}$ Ωcm². Approx. $1*10^{-4}$ Ωcm² was achieved experimentally. The surface-specific resistance is hereby determined from:
  a) The metal-semiconductor contact resistance on the front-side and rear-side of the semiconductor substrate layer 2.
  b) The specific conductivity of the semiconductor material 2 which is in turn proportional to the doping and the mobility of the charge carriers. The doping can hereby be chosen within certain limits, until at very high doping the power of the germanium cell suffers. The mobility is determined from the doping and the material quality.
  c) And the thickness of the layer 2 between the contacts 3 and 6.
- The thickness and doping of the layer 2 are variable here. It is also conceivable but technically complex to etch deep into the semiconductor layer 2 in order to reduce the spacing between the metallisations 3 and 6 locally in order to achieve such a surface-specific resistance.
- An alternative front-side contact (4, 6) which contains at least gold and germanium. (Eutectic gold-germanium is the most known contact on n-type GaAs).
- Solar cells according to the above claims which are designed for a light intensity of at least 100 kW/m².
- The cell surface (cell width) may be varied within the module in order to compensate for non-homogeneous illumination of the solar module.
- The application of the cell connectors is effected by ultrasonic welding (thermosonic bonding) of gold, aluminium or silver wire in the ball-wedge or wedge-wedge process, alternatively by electrowelding or soldering.

The present invention is suitable also for solar cells which are intended to be operated under unconcentrated sunlight. In particular the embodiment according to FIGS. 6 and 8 for solar cell modules for use in space is interesting. The surface proportions here which must be configured for the contacts 6 and B6 are in the thousandth range. As also when used as concentrator module, the connection of the solar cells and bypass diodes is effected exclusively on the front-side, which also can significantly simplify the module production.

FIG. 10 shows the efficiency which was achieved with a variant according to FIG. 2*b* in a non-calibrated measurement. An efficiency of 31.3% with 585 suns could be achieved with a cell surface of approx. 20×6 mm². The contacting of the rear contact was hereby effected over 32 front-side metal surfaces 6 and 32 thin wire bonds. Triple epitaxy structures were used for use in space. The processing corresponds extensively to the processing of III-V space solar cells.

The invention claimed is:

1. A solar cell module comprising at least two solar cell elements connected in series, disposed respectively with a rear-side metallization on a carrier structure, each of the at least two solar cell elements including:
   a rear side metallization structure, a first supporting semiconductor layer comprising a first type of doping adjacent to the rear side metallization structure, a second semiconductor layer structure disposed on a front-side of the first supporting semiconductor layer comprising a second type of doping complementary to the first type of doping, a first front-side metallization and a second front-side metallization, the first front-side metallization contacting the second semiconductor layer structure electrically, and the second front-side metallization being spaced from the first front-side metallization and the second semiconductor layer structure;
   wherein between the second front-side metallization and the rear-side metallization structure, only the supporting semiconductor layer is situated;
   wherein each of the at least two solar cell elements comprises at least one PN junction between the first supporting semiconductor layer and the second semiconductor layer structure;

wherein the rear side metallization structure of the first solar cell element and the rear side metallization structure of the second solar cell element are electrically insulated; and wherein the first front side metallization of a first of the at least two solar cells is electrically connected to the second front side metallization of a second of the at least two solar cells, forming the series connection.

2. A solar cell module according to claim 1 wherein at least one of: the supporting semiconductor layer; the rear-side metallization; and the second front-side metallization is at least one of: disposed such that the electrical contacting of the rear-side metallization to the second front-side metallization through the supporting semiconductor layer has a surface-specific resistance of less than $10^{-2}$ $\Omega cm^2$; and configured such that the electrical contacting of the rear-side metallization to the second front-side metallization through the supporting semiconductor layer has a surface-specific resistance of less than $10^{-2}$ $\Omega cm^2$.

3. A solar cell module according to claim 2 wherein the surface-specific resistance is less than $10^{-3}$ $cm^2$.

4. A solar cell module according to claim 3 wherein the surface-specific resistance is less than $5 \times 10^{-4}$ $\Omega cm^2$.

5. A solar cell module according to claim 1 wherein the rear-side metallization at least one of:
viewed in the layer plane, extends from the second front-side metallization up to the first front-side metallization;
is a flat, unstructured metallization; and,
is a flat, structured metallization.

6. A solar cell module according to claim 1 further comprising a carrier structure which is disposed on the rear-side metallization side and has at least one of: a cooling plate; a cooling plate with a non-metallic front; and, a cooling plate with a ceramic front.

7. A solar cell module according to claim 6 wherein the cooling plate is configured as at least one of: a structure-supporting part of an active water cooling body; and, a structure-supporting part made of ceramic of an active water cooling body.

8. A solar cell module according to claim 6 wherein at least one of: the carrier structure has an electrically non-conductive layer which is disposed between the cooling plate and at least one of the rear-side metallization, an adhesive layer and a ceramic layer; and, the carrier structure has an electrical conductor structure which is disposed between the cooling plate and the rear-side metallization.

9. A solar cell module according to claim 8 wherein the electrical conductor structure has, on the rear-side metallization side, at least one of: a conductive adhesive layer; and, a solder layer, and, on the cooling plate side, a strip conductor structure.

10. A solar cell module according to claim 1 further comprising a cell connector which contacts the two solar cell elements on their front-sides.

11. A solar cell module according to claim 10 wherein the cell connector is configured as a wire.

12. A solar cell module according to claim 10 wherein the cell connector connects electrically the first front-side metallization of the first of the solar cell elements connected on the front-side to the second front-side metallization of the second of the solar cell elements connected on the front-side.

13. A solar cell module according to claim 10 wherein the cell connector comprises a wire which comprises at least one of gold, silver and aluminium.

14. A solar cell module according to claim 1 wherein a bypass diode with reversed polarity is connected in parallel to at least one of the solar cell elements.

15. A solar cell module according to claim 14 wherein a bypass diode with reversed polarity is connected in parallel to each solar cell element.

16. A solar cell module according to claim 14 wherein at least one of the solar cell elements together with the bypass diode has a common portion of the supporting semiconductor layer.

17. A solar cell module according to claim 14 wherein at least one of the bypass diodes on the front-side thereof oriented away from the carrier structure has a first front-side metallization and a second front-side metallization spaced from the first front-side metallization.

18. A solar cell module according to claim 14 wherein at least one of the bypass diodes has a supporting semiconductor layer with a first doping, a layer structure which is disposed on the front-side of the supporting semiconductor layer which is oriented away from the carrier structure and is adjacent to the supporting semiconductor layer, said layer structure having at least one doping complementary to the first doping, and a rear-side metallization which is disposed on the rear-side of the supporting semiconductor layer which is situated opposite the layer structure and is adjacent to the supporting semiconductor layer.

19. A solar cell module according to claim 17 wherein, in the case of the at least one bypass diode, the first front-side metallization contacts the layer structure electrically, and the second front-side metallization, electrically insulated from the first front-side metallization and the layer structure, is disposed on the front-side of the supporting semiconductor layer adjacent to the supporting semiconductor layer.

20. A solar cell module according to claim 18 wherein, in the case of the at least one bypass diode, the first front-side metallization contacts the layer structure electrically, and the second front-side metallization, electrically insulated from the first front-side metallization and the layer structure, is disposed on the front-side of the supporting semiconductor layer adjacent to the supporting semiconductor layer.

21. A solar cell module according to claim 17 wherein at least one of the solar cell elements on the front-side of the supporting semiconductor layer which is oriented away from the carrier structure and adjacent to said semiconductor layer has a metallic front-side contact which is insulated electrically from the front-side metallizations and the layer structure and is connected electrically to the first front-side metallization of the bypass diode via a cell connector.

22. A solar cell module according to claim 14 wherein the electrical connection of the solar cell elements and the bypass diodes is configured exclusively on the front-side which is oriented away from the carrier structure.

23. A solar cell module according to claim 22 wherein the electrical connection is configured via cell connectors.

24. A solar cell module according to claim 1 wherein the supporting semiconductor layer has a thickness of less than 200 μm.

25. A solar cell module according to claim 1 further comprising at least one of a germanium layer, a p-doped germanium layer, a gallium arsenide layer and a silicon layer as supporting semiconductor layer.

26. A solar cell module according to claim 1 wherein the semiconductor structure having the supporting semiconductor layer and the layer structure is monocrystalline and has at least two photoelectrically active p-n junctions having different band gaps.

27. A solar cell module according to claim 1 wherein at least one of:
- at least one of the first front-side metallization and the second front-side metallization has an alloyed metal layer structure; and,
- at least one of the first front-side metallization and the second front-side metallization is configured in the form of at least one of a continuous layer structure and a plurality of non-continuous islands.

28. A solar cell module according to claim 1 wherein at least one of: the second front-side metallization has precisely one continuous metallization surface; and, the second front-side metallization has at least two continuous metallization surfaces which are disposed at a spacing from each other.

29. A solar cell module according to claim 1 wherein the first doping is one of a p-doping and an n-doping.

30. A solar cell module according to claim 1 further comprising a parallel connection of at least two series connections of solar cell elements, each said series connections of solar cell elements having at least two series-connected solar cell elements connected on the front-side.

31. A solar cell module according to the preceding claim 30 wherein each solar cell element of one series connection is connected in parallel to a solar cell element of at least another series connection.

32. A solar cell module according to claim 1 wherein, viewed in the layer plane, at least two of the solar cell elements have at least one of different total surface areas and different surface areas of their layer structures.

33. A solar cell module according to claim 1 further comprising at least one of an encapsulation disposed on the front-side and a transparent plate which has a transparent filling compound applied as encapsulation.

34. A solar cell module according to claim 33 wherein the filling compound comprises at least one of silicone and a glass plate.

35. Use of a solar cell module comprising the steps:
- providing a solar cell module according to claim 1 in a concentrator arrangement.

\* \* \* \* \*